United States Patent
Petropoulos

Patent Number: 6,049,207
Date of Patent: Apr. 11, 2000

[54] DOUBLE-DUTY GRADIENT COIL ASSEMBLY HAVING TWO PRIMARY GRADIENT COIL SETS AND A COMMON SCREENING COIL SET

[75] Inventor: Labros S. Petropoulos, Solon, Ohio

[73] Assignee: Picker International, Inc., Highland Heights, Ohio

[21] Appl. No.: 09/200,659

[22] Filed: Nov. 25, 1998

[51] Int. Cl.[7] .................................................. G01V 3/00
[52] U.S. Cl. ........................................... 324/318; 324/322
[58] Field of Search .................................... 324/318, 322, 324/319, 320, 300, 307, 309, 312, 314

[56] References Cited

U.S. PATENT DOCUMENTS

| | | | |
|---|---|---|---|
| 4,794,338 | 12/1988 | Roemer et al. | 324/318 |
| 4,978,920 | 12/1990 | Mansfield et al. | 324/318 |
| 5,132,618 | 7/1992 | Sugimoto | 324/318 |
| 5,296,810 | 3/1994 | Morich | 324/318 |
| 5,561,371 | 10/1996 | Schenck | 324/318 |
| 5,708,360 | 1/1998 | Yui et al. | 324/318 |
| 5,736,858 | 4/1998 | Katznelson et al. | 324/318 |

*Primary Examiner*—Louis Arana
*Attorney, Agent, or Firm*—Fay, Sharpe, Fagan, Minnich & McKee, LLP

[57] ABSTRACT

A method of designing a shielded gradient coil assembly (22) for magnetic resonance imaging systems is provided. The gradient coil structure comprises two sets of primary gradient coils (60, 62) and a single set of a shielded (screening) coils (64). This configuration is suitable for MR applications utilizing a double duty gradient configuration including a high-efficiency primary coil set that enhances the performance of ultra fast MR sequencing while minimizing the dB/dt and eddy current effects, and including a low-efficiency primary coil set having a high-quality gradient field that is suitable for conventional imaging applications with inherently low dB/dt and eddy current levels. In addition, a minimum inductance/energy algorithm assists in the design of the two primary and the one secondary gradient sets.

22 Claims, 4 Drawing Sheets

DOUBLE-DUTY GRADIENT COIL ASSEMBLY HAVING TWO PRIMARY GRADIENT COIL SETS AND A COMMON SCREENING COIL SET

BACKGROUND OF THE INVENTION

The present invention relates to the magnetic resonance arts. It finds particular application in conjunction with gradient coils for use in magnetic resonance imaging, and will be described with particular reference thereto. However, it is to be appreciated that the present invention also finds application in conjunction with other applications which generate gradient magnetic fields.

Gradient coil assemblies are commonly pulsed with electrical current pulses to produce magnetic gradients across the main magnetic field in the vicinity of an imaging region within a magnetic resonance imaging system. Previously methods for production for magnetic gradients in magnetic resonance imaging systems consisted of winding discrete coils in a bunched or distributed fashion on an electrically insulating hollow cylindrical former and driving the coils with a current source of limited voltage.

Conventional bunched coil designs include the Maxwell and the Modified Maxwell Pair for z-gradient production, and the Golay or Modified Golay (multi-arc) Saddle Coils for x and/or y-gradient production. Typically, these methods consisted of iteratively placing coil loops or arcs on the cylindrical former until the desired gradient strength, gradient uniformity, and inductance (related to stored energy) were achieved. These previous designs were generally developed in a "forward approach" whereby a set of initial coil positions were defined (i.e., the initial coil distribution), the fields and the inductance/energy calculated, and if not within particular design parameters, the coil positions would be shifted (statistically or otherwise) and results re-evaluated. The iterative procedure continued until a suitable design was obtained.

More recent methods of generating magnetic fields in magnetic resonance imaging systems utilize an "inverse approach" method. In the inverse approach method, the gradient magnetic field is forced to match predetermined values at specified spatial locations inside the imaging volume and a continuous current density is calculated which is capable of producing such a field. The inverse approach method assumes that the primary gradient coil has finite dimensions while those of the secondary or shield coil are left unrestricted (infinite). After the generation of continuous current distributions for both the primary and the shield coils, an apodization algorithm is performed on the continuous current density of the shield coil in order to restrain it to desirable dimensions. Following the modification of the shielding coil's continuous current, the Stream Function technique is employed in order to obtain discrete current patterns for both coils. Application of the Biot-Savart law to the discrete current pattern ensures that the discretization procedure was proper. This approach created generally more energy efficient gradient coil assemblies with higher gradient strengths and faster slew rates as compared to the forward approach method.

One particular prior art approach is described in U.S. Pat. No. 5,296,810 to Morich. Morich describes a cylindrically shaped shielded gradient coil assembly for magnetic resonance applications. Morich uses the inverse approach method of designing gradient coil assemblies where the primary coil has a finite length while the length of the shielding coil is considered infinite. This configuration generates coils with high gradient strengths and slew rates, while at the same time reduces the eddy current effects when the length of the shield coil is substantially longer (20% or more) than the length of the primary coil. In order to restrain the current of the shielding coil within desired dimensional boundaries, apodization techniques (e.g., guassian apodization) are employed. In this manner, the overall length of the shielding coil is approximately 20% longer than the total length of the primary gradient coil. According to this invention, there is a one-to-one correspondence between the number of primary coils and secondary coil sets. Thus, the number of primary and secondary sets on the radial build up is always identical.

Another prior art shielded gradient coil design, based on the inverse approach method, is described in U.S. Pat. No. 5,132,618 to Sugimoto. In this design, both the primary and the shielded coil lengths were assumed infinite and continuous current densities for both the primary and the secondary coil are modeled based on this assumption. In order to restrain the current densities on both the primary and secondary coils, truncation is again employed. Although the outcome of this method is similar to that of the Morich patent discussed earlier, the additional truncation of the primary coil's current in this case introduces increased levels of eddy current effects inside the imaging region. According to this invention, there is a one-to-one correspondence between the number of primary coils and secondary coil sets. Thus, the number of primary and secondary sets on the radial build up is always identical.

U.S. Pat. No. 4,794,338, to Roemer, et al. discloses an alternative approach of designing a shielded gradient coil set based on the forward approach method. The outcome is a shielded gradient coil set with a moderate to low efficiency rate in terms of gradient strength and slew rate. Further, there is no precondition to the method of controlling the eddy current effects inside the imaging region. According to this invention, there is a one-to-one correspondence between the number of primary coils and secondary coil sets. Thus, the number of primary and secondary sets on the radial build up is always identical.

As described in the prior art references above, the design of a conventional shielded gradient coil set has been generally based on the assumption that for each primary coil there is a corresponding screening coil which shields the fringe field of the primary coil in the vicinity of the magnet dewar and magnet shields. According to this methodology, a double duty shielded gradient coil set must include two sets of primary coils (x, y, z) and two sets of secondary coils (x, y, z). Specifically, each screening coil can only be related to one primary coil, and thus, in the case of a double duty gradient coil set, six primary and six secondary coils are necessary.

U.S. Pat. No. 5,736,858 to Katznelson, et al. discloses such a double duty coil geometry having two sets of primary coils shielded by two sets of shielding coils, where each primary coil has a one-to-one correspondence with a shielding coil. That is, two different shielding coils are employed to screen two different primary coils with different lengths and imaging volumes. Therefore, the number of primary and secondary coils in the gradient build-up are always identical. The Katznelson coil geometry was designed using the inverse approach method where trade-offs between linearity and coil performance are taken into account. In addition, the imaging volume, and the performance levels of the two gradient coil sets are different. Furthermore, both primary gradient coil sets have different lengths. Specifically, the primary and shield gradient coil combination with the better linearity, lower efficiency, and larger imaging volume, is longer lengthwise than the primary and shield coil combination that has higher efficiency but lower field quality and smaller imaging volume. Thus, the complete gradient coil configuration consists of twelve gradient coils (six primary coil groups and six screening coil groups) configured as two separate modular shielded gradient coil entities, each consisting of three primary and three shielded coils The present invention contemplates a new and improved shielded gradient coil assembly shielded gradient coil assembly having two primary gradient coil sets and a common screening coil set which overcomes the above-referenced problems and others.

SUMMARY OF THE INVENTION

The present invention is direction to a concept of designing a gradient coil structure comprising of two sets of primary gradient coils and one set of a shielded (screening) coils. This configuration is suitable for MR applications utilizing a double duty gradient configuration including a high-efficiency primary coil set that enhances the performance of ultra fast MR sequencing while minimizing the dB/dt and eddy current effects, and including a low-efficiency primary coil set having a high-quality gradient field that is suitable for conventional imaging applications with inherently low dB/dt and eddy current levels. In addition, a minimum inductance/energy algorithm assists in the design of the two primary and the one secondary gradient sets.

The design concept of the present invention is suitable for use with cylindrical shaped gradient coils, as well as other geometrical structures, such as, elliptical, biplanar, flared etc. Additional applications include the use of the proposed concept to design distributed or bunched gradient coils using iterative methodologies which can include conventional or optimized shielding techniques. Finally, the proposed invention can be expanded to the design of a gradient structure where the number of primary coil sets is always greater than the number of the secondary sets by at least one, while the number of shielding coils cannot be zero.

In accordance with one aspect of the present invention, a method of designing a gradient coil assembly for a magnetic resonance imaging system is disclosed. The method includes (a) generating a first continuous current distribution for a first primary coil set such that the first continuous current distribution is confined within predetermined finite geometric boundaries of a first surface defined by two dimensions and generates a first magnetic gradient field across an imaging region, the first magnetic gradient field constrained to predetermined values at specified spatial locations within the imaging region; (b) generating a second continuous current distribution for a second primary coil set such that the second continuous current distribution is confined within predetermined finite geometric boundaries of a second surface defined by two dimensions and generates a second magnetic gradient field across an imaging region, the second magnetic gradient field constrained to predetermined values at specified spatial locations within the imaging region; and (c) generating a third continuous current distribution for a shielding coil set such that the third continuous current distribution is confined within predetermined finite geometric boundaries of a surface surrounding the primary coil set and second primary coil set, such that the third continuous current distribution generates a magnetic field which substantially cancels in an area outside a region defined by the shielding coil set a first fringe magnetic field generated by the first continuous current density and a second fringe magnetic field generated by the second continuous current density.

In accordance with another aspect of the present invention, a method of designing a gradient coil assembly for a magnetic resonance imaging system is disclosed. The method includes a) defining characteristics of i) a first primary gradient coil set and a common shielding coil set, and ii) a second primary gradient coil set and the common shielding coil set; b) optimizing i) the first primary gradient coil set with the common shielding coil set and ii) the second gradient coil set with the common shielding coil set utilizing an energy/inductance minimization algorithm; c) evaluating eddy currents within a prescribed imaging volume for i) the first primary gradient coil set and the common shielding coil set, and ii) the second primary gradient coil set and the common shielding coil set; d) modifying at least one of the characteristics defined in step a), and repeating steps b) through d) when the eddy currents from either i) the first primary gradient coil set and the common shielding coil set or ii) the second primary gradient coil set and the common shielding coil set do not meet an eddy current target value for the prescribed imaging volume; e) discretizing i) the first primary gradient coil set and the common shielding coil set and ii) the second primary gradient coil set and the common shielding coil set when the eddy currents from either i) the first primary gradient coil set and the common shielding coil set or ii) the second primary gradient coil set and the common shielding coil set meet the eddy current target value for the prescribed imaging volume; and f) modifying at least one of the characteristics defined in step a) and repeating steps b) through f) when the integer number of turns of i) the first primary gradient coil set do not equal the integer number of turns of the common shielding coil set or when ii) the integer number of turns of the second primary gradient coil set do not equal the integer number of turns of the common shielding coil set.

In accordance with yet another aspect of the present invention, a magnetic resonance imaging system scanner includes a main magnet for generating a main magnetic field through an examination region. The main magnet is arranged such that its geometry defines the examination region. A couch supports a subject to be examined within the examination region. A radio frequency coil is disposed adjacent the examination region for transmitting radio frequency signals into the examination region and selectively exciting dipoles disposed therein. A radio frequency transmitter drives the radio frequency coil. A receiver receives magnetic resonance signals from resonating dipoles within the examination region. An image processor reconstructs an image representation from the received magnetic resonance signals for display on a human readable display. The scanner also includes a gradient coil assembly for generating substantially linear magnetic gradients across the main magnetic field. The gradient coil assembly includes a first primary gradient coil set disposed about the examination region including an array of conductive coil loops arranged such that a current density flowing thereon generates the substantially linear magnetic gradients. The gradient coil assembly also includes a second primary gradient coil set disposed about the examination region including an array of conductive coil loops arranged such that a current density flowing thereon generates the substantially linear magnetic gradients. The gradient coil assembly further includes a shielding coil set disposed about the first primary coil set and the second primary coil set including an array of conductive coil loops arranged such that a current density flowing thereon substantially shields a fringe field from the first primary coil set and a fringe field from at least one of the second primary coil set and the first and second primary coil sets operating concurrently.

In accordance with a further aspect of the present invention, a method of designing gradient coil assemblies which include a first primary coil, a second primary coil, and a single shield coil for magnetic resonance imaging systems is disclosed. The method includes a) selecting a first primary coil current distribution for the first primary coil which when operated with the shield coil generates gradient pulses in a imaging region with rapid rise times for ultra fact imaging sequences; b) selecting a second primary coil current distribution for the second primary coil which when operated with the shield coil and one of i) alone, and ii) in combination with the first primary coil generates accurate gradient pulses in the imaging region with slower rise times than the first primary coil; and c) selecting a single shield coil current distribution which substantially cancels gradient magnetic fields outside of the imaging region when i) the first primary coil and the shield coil are operated concurrently and ii) one of the second primary coil and the combination of the first and second primary coils are operated concurrently with the shield coil.

One advantage of the present invention is the provision of a method for designing a double-duty shielded gradient coil assembly that utilizes a single shielded gradient coil set to screen two independent primary gradient coil sets.

Another advantage of the present invention is the provision of a double-duty shielded gradient coil assembly that utilizes a single shield coil to screen two electrically and/or mechanically different primary coils.

Another advantage of the present invention is the provision of a double-duty shielded gradient coil assembly that utilizes a lesser number of shielding coil sets to screen a larger number of primary coil sets.

Another advantage of the present invention is the provision of a method for designing a double-duty, single shield-two primary coil gradient set using the inverse approach method and eddy current optimization.

Another advantage of the present invention is the provision of a shielded, double-duty gradient coil assembly having improved gradient strength and rise time over existing gradient coil structures.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENT

Figure 1:
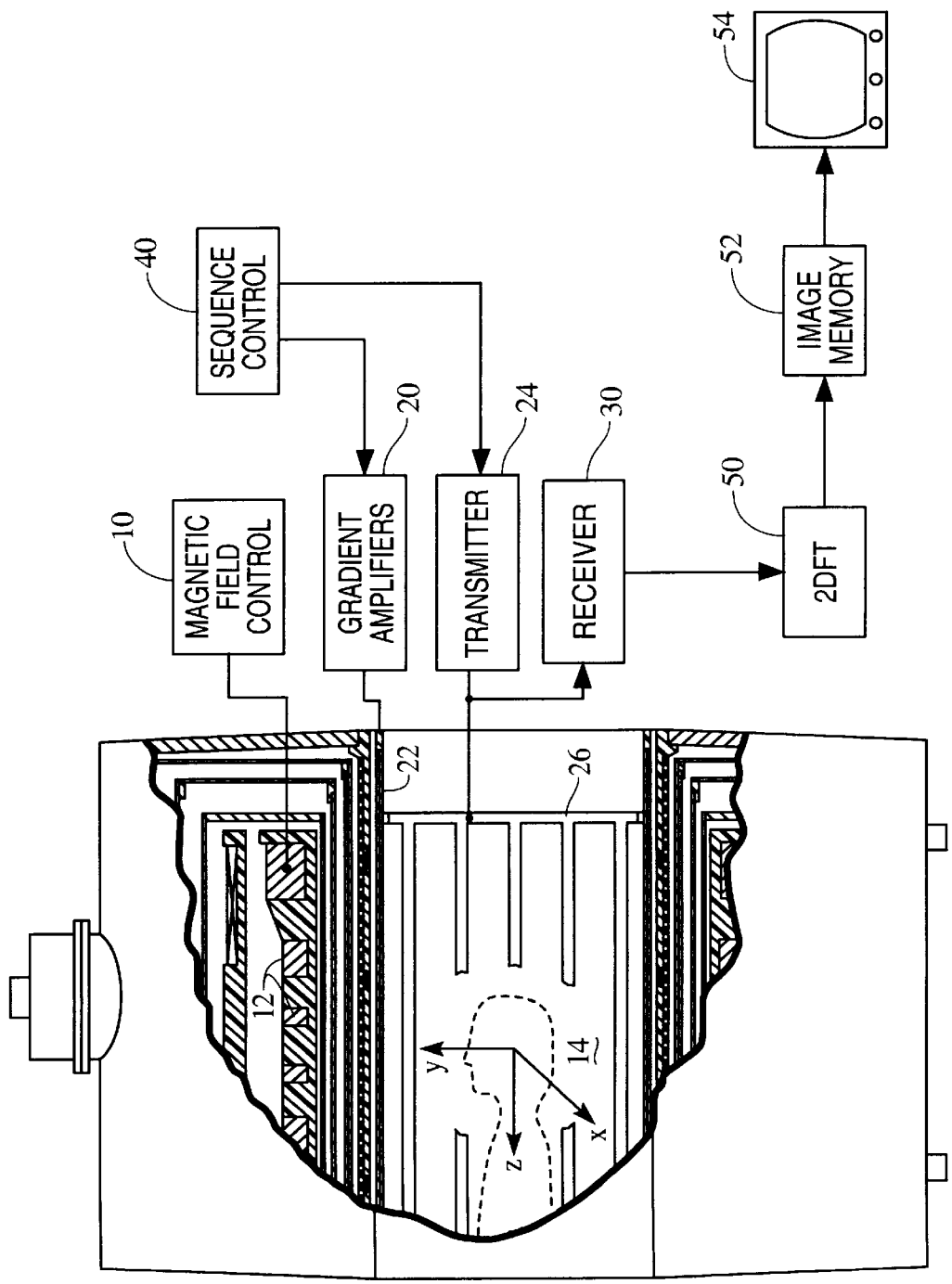
FIG. 1 is a diagrammatic illustration of a magnetic resonance imaging apparatus including a shielded, double-duty gradient coil assembly designed in accordance with the present invention.

With reference to FIG. 1, a main magnetic field control 10 controls superconducting or resistive magnets 12 such that a substantially uniform, temporally constant main magnetic field is created along a z axis through an examination region 14. A couch (not illustrated) supports a subject to be examined within the examination region 14. A magnetic resonance echo means applies a series of radio frequencies (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectrography sequences. More specifically, gradient pulse amplifiers 20 apply current pulses to one of two gradient coil sets associated with a double-duty gradient coil assembly 22 to create magnetic field gradients along x, y, and z axes of the examination region 14. As described in greater detail below, the shielded gradient coil structure 22 consists of two sets of primary coils and a single set of shielding or screening coils which are used to screen the fringe field of each primary coil set either individually or combined. A digital radio frequency transmitter 24 transmits radio frequency pulses or pulse packets to a whole-body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. For whole-body applications, the resonance signals are commonly picked up by the whole-body RF coil 26.

For generating images of local regions of the subject, specialized radio frequency coils are placed continuous to the selected region. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used to only receive resonance signals introduced by whole-body coil RF transmissions. The resultant radio frequency signals are picked up by the whole-body RF coil 26, the insertable RF coil, or other specialized RF coils and demodulated by a receiver 30, preferably a digital receiver.

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. For the selected sequence, the receiver 30 receives a plurality of data lines in rapid succession following each RF excitation pulse. Ultimately, the radio frequency signals received are demodulated and reconstructed into an image representation by a reconstruction processor 50 which applies a two dimensional Fourier transform or other appropriate reconstruction algorithm. The image may represent a planar slice through the patient, an array of parallel planar slices, a three dimensional volume, of the like. The image is then stored in an image memory 52 where it may be accessed by a display, such as a video monitor 54 which provides a human readable display of the resultant image.

Figure 2B:
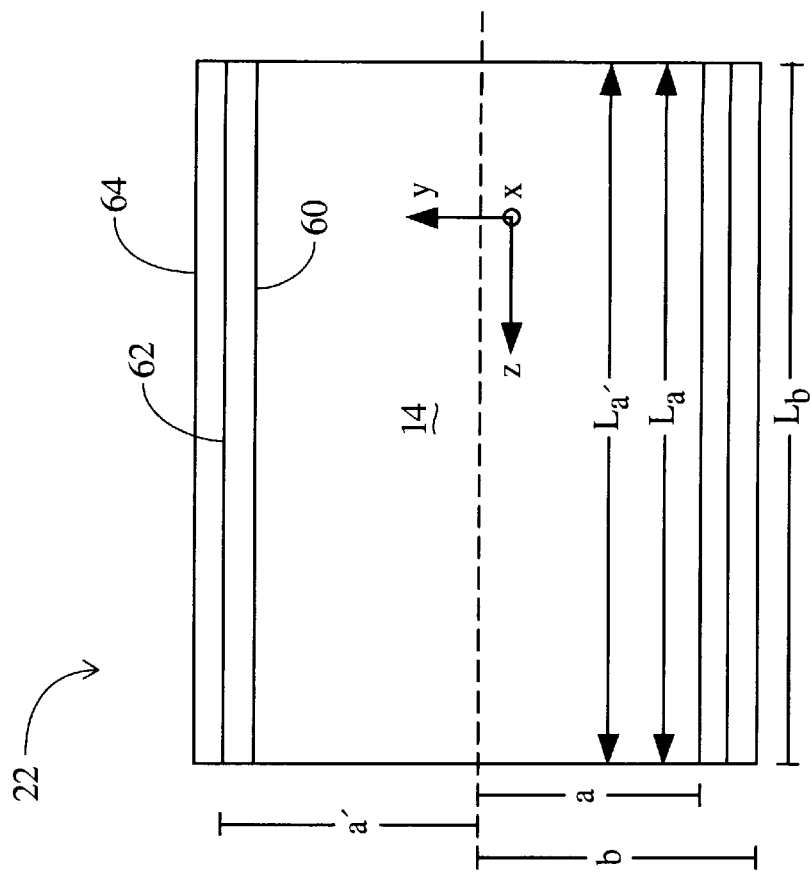
FIG. 2B is a diagrammatic illustration of a longitudinal sectional view of the shielded, double-duty gradient coil assembly of FIG. 1.
Figure 2A:
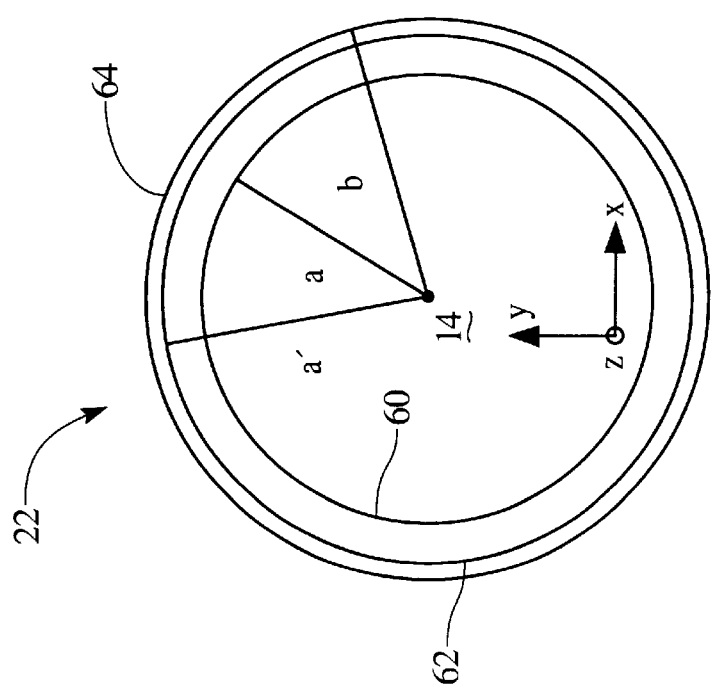
FIG. 2A is a diagrammatic illustration of an end view of the shielded, double-duty gradient coil assembly of FIG. 1.

Referring now to FIGS. 2A and 2B, the double-duty gradient coil structure 22 includes two independent sets of primary gradient coils 60, 62 and a single set of shielded (screening) coils 64 that screens the fringe field of each primary coil set, either individually or combined. The total length of the first primary coil set 60 is denoted as $L_a$, while the length of the second primary coil set 62 is denoted as $L_{a'}$. The two lengths $L_a$, $L_{a'}$ can be equal, or different from each other. In addition, the length of the common shielding coil set 64 is assumed infinite for mathematical calculations, but in physical reality is truncated to $L_b$. The radius of the first primary coil set is denoted as a, the radius of the second primary coil set is denoted as a', while the radius of the shielding coil set is denoted as b.

The first, high-efficiency, independently-shielded, modular gradient coil set 60 (having a first set of primary gradient coils and the same set of shielding coils as a second set of primary coils) is intended for use with high-speed imaging applications, such as ultra fast MR sequencing, where high-field strength but lower field quality is acceptable over a significantly smaller imaging volume. The second, low-efficiency, independently-shielded, modular gradient coil set 62 (having a second primary gradient coil set and the same shielding coil set as the first primary coil set), is intended for use with conventional MR imaging applications, and exhibits relatively low field strengths with high field quality (uniformity and linearity) over an imaging volume suitable for entire body coverage, with inherently low dB/dt and eddy current levels.

The theoretical development, the design procedure, and the results for an exemplary shielded gradient coil structure will now be discussed. Specifically, the theoretical development, the design, and the results of a gradient coil where the z component of the magnetic field varies linearly along the transverse direction (x, y-gradient coil), as well as, the axial gradient coil (z-gradient coil) will be presented. The x-gradient coil will be presented in its entirety as a representative for the transverse coils.

Figure 3:
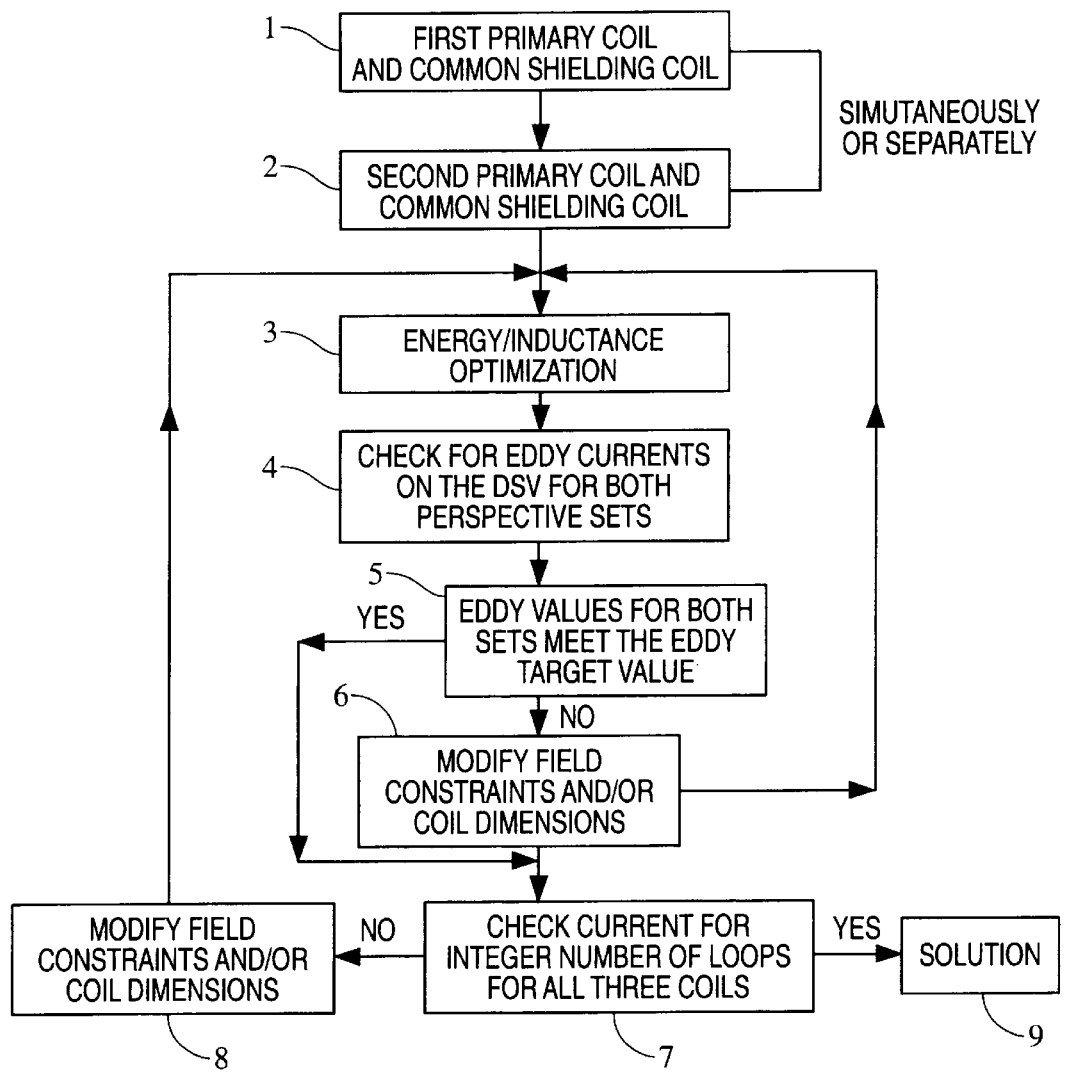
FIG. 3 is a flow chart for designing the shielded, double-duty gradient coil assembly of FIG. 1.

The flow chart for designing such a gradient coil structure is shown in FIG. 3. Initially, the geometric configurations of the first primary coil with the common shield (step 1) and the second primary coil with the common shield (step 2) are chosen. As a next step, the optimization process of each primary coil with the same common shield using an energy/inductance minimization algorithm is performed (step 3). Following this step, the eddy current inside a prescribed imaging volume is evaluated for both primary coil configurations (step 4). If the eddy currents from either primary coils with the common shield meet the eddy current target value for this particular volume (step 5), then proceed by discretizing each primary and the shielding coil. The goal is that each primary coil and the common shield coil must have exact integer number of turns when they share the same current (step 7). If this condition is not satisfied, then the field characteristics and/or coil radius and/or length are modified (step 8) and proceed again from step 3. If the eddy currents from the step 5 do not meet the target residual eddy current inside the imaging volume, the field characteristics and/or coil radius and/or length are modified (step 6) and proceed again from step 3. This cycle continues until an acceptable solution (step 9) is found that satisfies the target criteria.

The theoretical development of the energy optimization algorithm (step 3) will be discussed for both the transverse and the axial gradient coil. The presentation will be done for only one primary and screening coil structure since, the algorithm for optimizing the second primary and shielding coil structure is identical to the previous algorithm.

The design of a finite, shielded transverse (x) gradient coil involves the design of the primary coil (the coil that generates the gradient field) based on the inverse approach methodology. For this transverse coil the gradient magnetic field must be antisymmetric in the x direction around the geometric center of this coil, while it is symmetric along the y and z directions. To generate such a field, the analytical expression of the current for the primary coil can be written as:

$$\vec{J}^a(\vec{r}) = [j_\phi^a(\phi, z)\hat{a}_\phi + j_z^a(\phi, z)\hat{a}_z]\delta(\rho - a) \quad (1)$$

where $\delta(\rho-a)$ is the restriction that the current is confined on the cylindrical surface with radius a. The restriction to inner coil length, the confinement of the current density on the cylindrical surface, the azimuthal and axial symmetries for the $j^a_\phi$ and $j^a_z$ and the demand that the current density obeys the continuity equation provides the Fourier series expansion for both components around the geometric center of the coil as follows:

$$j_\phi^a(\phi, z) = \cos\phi \sum_{n=1}^{\infty} j_{\phi n}^a \cos k_n z \text{ for } |z| \leq \frac{L_a}{2} \quad (2)$$

$$j_z^a(\phi, z) = \sin\phi \sum_{n=1}^{\infty} \frac{j_{\phi n}^a}{k_n a} \sin k_n z \text{ for } |z| \leq \frac{L_a}{2} \quad (3)$$

where $j^a_{\phi n}$ are the Fourier coefficients, $L_a$ represents the total length of the inner coil, and $k_n = (2n\pi)/L_a$ since the current cannot flow off the ends of the cylinder. Furthermore, both current components are zero for $|z| > L_a/2$.

In order minimize the fringe field of the primary coil in the area which is outside both the primary and the shielding coil, the Fourier transform of the current for the shielding coil must satisfy the following relationship:

$$j_\phi^b(\pm 1, k) = -\frac{aI_1'(ka)}{bI_1'(kb)} j_\phi^a(\pm 1, k) \quad (4)$$

with $$j_\phi^a(\pm 1, k) = \frac{L_a}{4} \sum_{n=1}^{\infty} j_{\phi n}^a \psi_n(k) \quad (5)$$

$$\psi_n(k) = \left[ \frac{\sin(k - k_n)\frac{L_a}{2}}{(k - k_n)\frac{L_a}{2}} + \frac{\sin(k + k_n)\frac{L_a}{2}}{(k + k_n)\frac{L_a}{2}} \right]$$

where $I'_m$, $K'_m$ represent the derivatives with respect to the argument of the modified Bessel functions of the first and the second kind.

In this case, the expression for the z component of the magnetic field in the area inside both coils can be written as:

$$B_z = \quad (6)$$

$$-\frac{\mu_0 a}{2\pi} \cos(\phi) \sum_{n=1}^{\infty} j_{\phi n}^a \int_{-\infty}^{\infty} dk\, k \cos kz\, \psi_n(k) I_1(k\rho) K_1'(ka) \left[ 1 - \frac{I_1'(ka) K_1'(kb)}{I_1'(kb) K_1'(ka)} \right]$$

Furthermore, the expression for the stored magnetic energy can also be written as:

$$W = \tag{7}$$
$$-\frac{\mu_0 a^2 L_a^2}{16} \sum_{n=1}^{\infty} \sum_{n'=1}^{\infty} j_{\phi n}^a j_{\phi n'}^a \int_{-\infty}^{\infty} dk \psi_n(k) \psi_{n'}(k) I_1'(ka) K_1'(ka) \left[ 1 - \frac{I_1'(ka) K_1'(kb)}{I_1'(kb) K_1'(ka)} \right]$$

As a next step, the functional ε is constructed in terms of W and $B_z$ as:

$$\varepsilon(j_n^a) = W - \sum_{j=1}^{N} \lambda_j \big(B_z(\vec{r}_j) - B_{zSC}(\vec{r}_j)\big)$$

where $\lambda_j$ are the Lagrange multipliers and $B_{zSC}$ represent the constraint values of the z component of the magnetic field at the specified N points. Minimizing E, a quadratic function of the current, with respect to the current coefficients $j^a_{\phi n}$, a matrix equation results which $j^a_{\phi n}$ must satisfy:

$$\sum_{n'=1}^{\infty} j_{\phi n'}^a \left\{ \frac{aL_a \pi}{2} \int_{-\infty}^{\infty} dk I_1'(ka) K_1'(ka) \psi_n(k) \psi_{n'}(k) \right\} \left[ 1 - \frac{I_1'(ka) K_1'(kb)}{I_1'(kb) K_1'(ka)} \right] = \tag{8}$$

$$\sum_{j=1}^{N} \lambda_j \cos(\phi_j) \int_{-\infty}^{\infty} dk k \cos k z_j \psi_n(k) I_1(k \rho_j) K_1'(ka) \left[ 1 - \frac{I_1'(ka) K_1'(kb)}{I_1'(kb) K_1'(ka)} \right]$$

where the evaluation of the Lagrange multipliers can be done via the constraint equation.

By truncating the previous infinite summations at M terms, and using compact notation, the previous expression is modified $$\sum_{n'=1}^{\infty} j_{\phi n'}^a C_{n',n} = \sum_{j=1}^{N} \lambda_j D_{jn} \tag{9}$$

or in matrix form $$J^a C = \lambda D \text{ or } J^a = \lambda D C^{-1} \tag{10}$$

but $$B_z = J^a D^S \text{ or } B_z = \lambda D C^{-1} D^t \tag{11}$$

which leads to $$\lambda = B_z [D C^{-1} D^t]^{-1} \text{ and } J^a = B_z [D C^{31 \ 1} D^t]^{-1} D C^{-1} \tag{12}$$

Inverting the previous matrix equation, a solution for $j^a_{\phi n'}$ and hence for the current density, is obtained. When the continuous current distribution for both the primary and shield coils is evaluated, the stream function technique is used to discretize the current density for both primary and shield coils in such a way that the absolute integer number of turns is obtained for both coils for a given common current value per loop. The discretization, the magnetic gradient field, and the eddy currents inside the desired imaging volume are then calculated proceeding with steps 4 through 9 of FIG. 3.

For the design of the primary x-gradient coil, the radius of the cylinder for the first primary coil is equal to 0.365620 m and its total length is restricted to 1.046800 m. For the second primary coil, the radius of the cylinder is equal to 0.361175 m with a total length equal to 1.015500 m. In addition, the radius of the secondary coil is equal to 0.443485 m. The constraints for the design of the first primary coil are shown in Table 1. The constraints for the second primary coil with the single shield are shown in Table 2.

TABLE 1

Constraint set used for the design for the first primary gradient coil and the common shield structure.
Values for ρ and z are in m, values for $B_{zsc}$ (2n) are in T.

| n | $\rho_i$ | $z_i$ | $B_{zsc}$ (2n) |
|---|---|---|---|
| 1 | 0.001 | 0.000 | 0.000020000 |
| 2 | 0.255 | 0.000 | 0.004845000 |
| 3 | 0.001 | 0.200 | 0.000016000 |

As shown in Table 1, the first constraint point defines a gradient strength for the first primary and single shield coil to be 20.0 mT/m, the second constraint point specifies a −5% linearity of the gradient field along the gradient (x) axis and up to the distance of 25.5 cm for the isocenter of the gradient field, while the third constraint point specifies a −20% uniformity of the gradient field inside the 45 cm imaging volume.

TABLE 2

Constraint set used for the design for the second primary gradient coil and the common shield structure.
Values for ρ and z are in m, values for $B_{zsc}$ (2n) are in T.

| n | $\rho_i$ | $z_i$ | $B_{zsc}$ (2n) |
|---|---|---|---|
| 1 | 0.001 | 0.000 | 0.000025800 |
| 2 | 0.245 | 0.000 | 0.0058193319 |
| 3 | 0.001 | 0.200 | 0.0000178229 |

As shown in Table 2, the first constraint point defines a gradient strength for the second primary and single shield coil to be 25.8 mT/m, the second constraint point specifies a −8% linearity of the gradient field along the gradient (x) axis and up to the distance of 24.5 cm for the isocenter of the gradient field, while the third constraint point specifies a −31% uniformity of the gradient field inside the 45 cm imaging volume.

With the presence of these constraints on Tables 1, 2 and the application of the inverse approach methodology of FIG. 3, the values for the Fourier coefficients for the current density of the first, the second primary and the single shield coil are generated. Applying the Stream Function technique to the continuous current densities for both the primary coils and the shielding coil, the discrete current patterns for these coils were generated. Specifically, the first primary and shield configuration, the Stream Function technique generates 22 discrete loops on the primary coil, and 12 loops on the single shield. The common current per loop is 328.19 amps. In this case, the eddy current from the discrete coil configuration is 0.182% over a 45 cm DSV.

Discretizing the second primary current density using 22 loops with a common current of 392.59 amps, and connecting it in series with the 12 discrete loops of the shielding coil (now the current per loop is the same as the second primary coil) generates the second primary coil configuration. In this case the eddy currents for the second primary loop with the single shield run in series with 392.59 amps are only 0.457%. If the optimization algorithm (step 3) of FIG. 3 was not employed, the eddy current levels of the second primary coil with the single shield will be on the order of 8.63% when the current flowing in both coils is equal to 392.59 amps per loop. Finally, Table 3 illustrates the magnetic properties of the first and second primary coils with the single shield.

TABLE 3

Gradient field characteristics for the first and the second primary coil using a common shield coil.

| Properties | First Primary Coil with Common Shield | Second Primary Coil with Common Shield |
|---|---|---|
| Gradient Strength (mT/m) | 20 | 25.8 |
| Gradient Linearity (ρ = ±22.5 cm) | 2.8% | 4.8% |
| Gradient Uniformity (z = ±20.0 cm) | 23% | 31% |
| Rise Time @ 700V | 315 μsec | 366 μsec |
| Slew Rate @ 700V | 60 T/m/sec | 70 T/m/sec |
| % Eddy Current on 45 cm DSV | 0.182% | 0.457% |

Initially, the design of the finite shielded transverse z-gradient (axial) coil involves the design of the primary coil (the coil that generates the gradient field) based on the inverse approach methodology. For this transverse coil, the gradient magnetic field must be antisymmetric in the z direction around the geometric center of this coil, while it is symmetric along the x and y directions. Thus in this case there is no azimuthal dependance on the current density. To generate such a field, the analytical expression of the current for the primary coil can be written as:

$$\vec{J}^a(\vec{\tau}) = j_\phi{}^a(z)\hat{\alpha}_\phi \delta(\rho - a) \quad (13)$$

where $\delta(\rho-a)$ is the restriction that the current is confined on the cylindrical surface with radius a. The restriction to inner coil length, the confinement of the current density on the cylindrical surface, the azimuthal and axial symmetries for the $j^a{}_\phi$ and the demand that the current density obeys the continuity equation provides the Fourier series expansion for both components around the geometric center of the coil as follows:

$$j_\phi^a(\phi, z) = \sum_{n=1}^{\infty} j_{\phi n}^a \sin k_n z \text{ for } |z| \leq \frac{L_a}{2} \quad (14)$$

where $j^a{}_{\phi n}$ are the Fourier coefficients, $L_a$ represents the total length of the inner coil, and $k_n = (2n\Pi)/L_a$ since the current cannot flow off of the ends of the cylinder. Furthermore, the current component is zero for $|z| > L_a/2$.

In order to minimize the fringe field of the primary coil in the area which is outside both the primary and the shielding coil, the Fourier transform of the current for the shielding coil must satisfy the following relationship:

$$j_\phi^b(k) = -\frac{aI_1(ka)}{bI_1(kb)} j_\phi^a(k) \quad (15)$$

with $$j_\phi^a(k) = \frac{iL_a}{2} \sum_{n=1}^{\infty} j_{\phi n}^a \psi_n(k) \quad (16)$$

$$\psi_n(k) = \left[ -\frac{\sin(k-k_n)\frac{L_a}{2}}{(k-k_n)\frac{L_a}{2}} + \frac{\sin(k+k_n)\frac{L_a}{2}}{(k+k_n)\frac{L_a}{2}} \right]$$

where $I_m$, $K_m$ represent the derivatives with respect to the argument of the modified Bessel functions of the first and second kind.

In this case, the expression for the z component of the magnetic field in the area inside both coils can be written as:

$$B_z = \quad (17)$$

$$-\frac{\mu_0 a}{2\pi} \sum_{n=1}^{\infty} j_{\phi n}^a \frac{L_a}{2} \int_{-\infty}^{\infty} dk\, k \sin kz\, \psi_n(k) I_0(k\rho) K_1(ka) \left[ 1 - \frac{I_1(ka)K_1(kb)}{I_1(kb)K_1(ka)} \right]$$

Furthermore, the expression for the stored magnetic energy can also be written as:

$$W = \quad (18)$$

$$\frac{\mu_0 a^2 L_a^2}{8} \sum_{n=1}^{\infty} \sum_{n'=1}^{\infty} j_{\phi n}^a j_{\phi n'}^a \int_{-\infty}^{\infty} dk\, \psi_n(k)\psi_{n'}(k) I_1(ka)K_1(ka) \left[ 1 - \frac{I_1(ka)K_1(kb)}{I_1(kb)K_1(ka)} \right]$$

As a next step, we construct the functional $\epsilon$ in terms of W and $B_2$ as $$\varepsilon(j_n^a) = W - \sum_{j=1}^{N} \lambda_j \left( B_z(\vec{r}_j) - B_{zSC}(\vec{r}_j) \right)$$

where $\lambda_j$ are the Lagrange multipliers and $B_{zSC}$ represent the constraint values of the z component of the magnetic field at the specified N points. Minimizing E, a quadratic function of the current, with respect to the current coefficients $j^a{}_{\phi n}$, results in a matrix equation which $j^a{}_{\phi n}$, must satisfy:

$$\sum_{n'=1}^{\infty} j_{\phi n'}^a \left\{ aL_a\pi \int_{-\infty}^{\infty} dk\, I_1(ka)K_1(ka)\psi_n(k)\psi_{n'}(k) \right\} \left[ 1 - \frac{I_1(ka)K_1(kb)}{I_1(kb)K_1(ka)} \right] = \quad (19)$$

$$-\sum_{j=1}^{N} \lambda_j \int_{-\infty}^{\infty} dk\, k \sin kz_j \psi_n(k) I_0(k\rho_j) K_1(ka) \left[ 1 - \frac{I_1(ka)K_1(kb)}{I_1(kb)K_1(ka)} \right]$$

where the evaluation of the Lagrange multipliers can be done via the constraint equation.

By truncating the previous infinite summations at M terms, and using compact notation the, previous expression is modified $$\sum_{n'=1}^{\infty} j_{\phi n'}^a C_{n',n} = \sum_{j=1}^{N} \lambda_j D_{jn} \quad (20)$$

or in matrix form $$J^a C = \lambda D \text{ or } J^a = \lambda D C^{-1} \quad (21)$$

but $$B_z = J^a D^t \text{ or } B_z = \lambda D C^{-1} D^t \quad (22)$$

which leads to $$\lambda = B_z [DC^{-1} D^t]^{-1} \text{ and } J^a = B_z [DC^{-1} D^t]^{-1} DC^{-1} \quad (23)$$

Inverting the previous matrix equation, a solution for $j^a_{\phi n}$, and hence for the current density, is obtained. When the continuous current distribution for both the primary and shield coils is evaluated, the application of the center of mass technique yields to the discrete loop patterns for both primary and shield coils with the extra constraint that the absolute integer number of turns for both coils for a given common current value per loop must be obtained. The discretization, the magnetic gradient field and the eddy currents inside the desired imaging volume are then calculated proceeding with steps 4 through 9 of FIG. 3.

Similar design procedures were followed for the axial gradient coil. In this case the radius of the cylinder for the first primary coil is equal to 0.358500 m and its total length is restricted to 1.0440 m. For the second primary coil, the radius of the cylinder is equal to 0.36225 m with a total length equal to 1.0660 m. In addition, the radius of the common secondary coil is equal to 0.433225 m. For the design of the first primary coil the constraints are shown in Table 4. For the second primary coil with the common shield the constraints are shown in Table 5.

TABLE 4

Constraint set used for the design for the first primary gradient coil and common shield structure.
Values for $\rho$ and z are in m, values for $B_{zsc}$ (2n) are in T.

| n | $\rho_i$ | $z_i$ | $B_{zsc}$ (2n) |
|---|---|---|---|
| 1 | 0.0000 | 0.001 | 0.000020000 |
| 2 | 0.0000 | 0.225 | 0.004275000 |
| 3 | 0.1625 | 0.001 | 0.000020000 |
| 4 | 0.2250 | 0.001 | 0.000020000 |

As shown in Table 4, the first constraint point defines a gradient strength for the first primary and common shield coil to be 20.0 mT/m, the second constraint point specifies a −5% linearity of the gradient field along the gradient (z) axis and up to the distance of 22.5 cm for the isocenter of the gradient field, while the rest of the constraint points specify the uniformity of the gradient field inside the 45 cm imaging volume.

TABLE 5

Constraint set used for the design for the second primary gradient coil and common shield structure.
Values for $\rho$ and z are in m, values for $B_{zsc}$ (2n) are in T.

| n | $\rho_i$ | $z_i$ | $B_{zsc}$ (2n) |
|---|---|---|---|
| 1 | 0.0000 | 0.001 | 0.0000300000 |
| 2 | 0.0000 | 0.225 | 0.0061752400 |
| 3 | 0.1625 | 0.001 | 0.0000312676 |
| 4 | 0.2250 | 0.001 | 0.000298790 |

As shown in Table 5, the first constraint point defines a gradient strength for the second primary and common shield coil to be 30.0 mT/m, the second constraint point specifies a −5% linearity of the gradient field along the gradient z axis and up to the distance of 22.5 cm for the isocenter of the gradient field, while the rest of the constraint points specify the uniformity of the gradient field inside the 45 cm imaging volume.

With the presence of these constraints on Tables 4, 5 and the application of the inverse approach methodology of FIG. 3, the values for the Fourier coefficients for the current density of the first, the second primary, and the single shield coil are generated. Applying the center of mass technique to the continuous current densities for both the primary coils and the shielding coil, the discrete current patterns for these coils were generated. Specifically, for the first primary and the shield configuration, the center of mass technique generates 52 discrete loops on the primary coil, and 34 loops on the single shield. The common current per loop is 318.88 amps. In this case, the eddy current from the discrete coil configuration is 0.329% over a 45 cm DSV.

Discretizing the second primary current density using 60 loops with a common current of 391.65 amps, and connecting it in series with the 34 discrete loops of the shielding coil (now the current per loop is the same as the second primary coil) generates the second primary coil configuration. In this case, the eddy currents for the second primary loop with the single shield run in series with 391.65 amps are only 0.542%. If the optimization algorithm (step 3) of FIG. 3 was not employed, the eddy current levels of the second primary coil with the single shield will be on the order of 11.21% when the current flowing in both coils is equal to 392.59 amps per loop. Finally, Table 6 illustrates the magnetic properties of the first and second primary coils with the single shield.

TABLE 6

Gradient field characteristics for the first and the second primary coil using a common shield coil.

| Properties | First Primary Coil with Common Shield | Second Primary Coil with Common Shield |
|---|---|---|
| Gradient Strength (mT/m) | 20 | 30 |
| Gradient Linearity ($\rho$ = ±22.5 cm) | −5.4% | −6.36% |
| Gradient Uniformity (z = ±20.0 cm) | 7.56% | 9.94% |
| Rise Time @ 700V | 217 $\mu$sec | 360 $\mu$sec |
| Slew Rate @ 700V | 91 T/m/sec | 72 T/m/sec |
| % Eddy Current on 45 cm DSV | 0.329% | 0.542% |

Figure 4A:
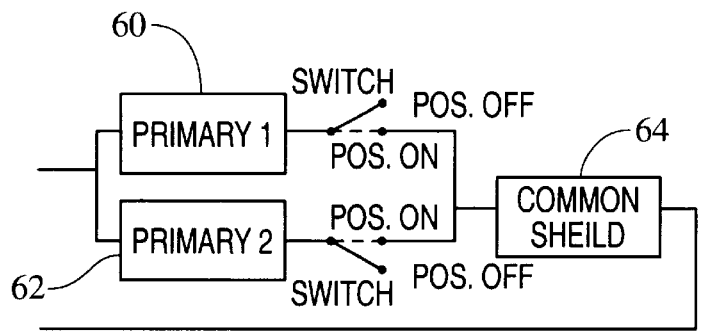
FIGS. 4A, 4B, and 4C show alternate ways of electrically connecting the two primary coil sets with the common shield coil set of the gradient coil assembly of FIG. 1.
Figure 4B:
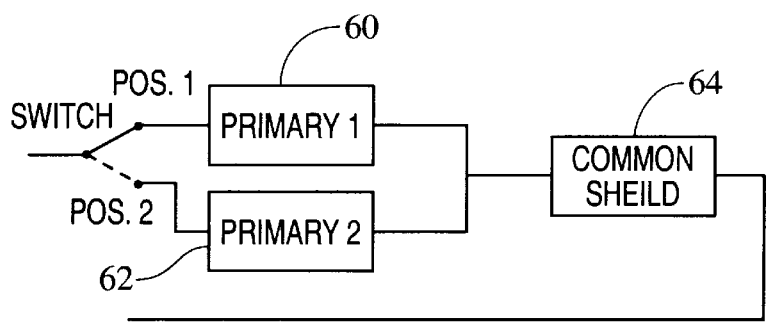
Figure 4C:
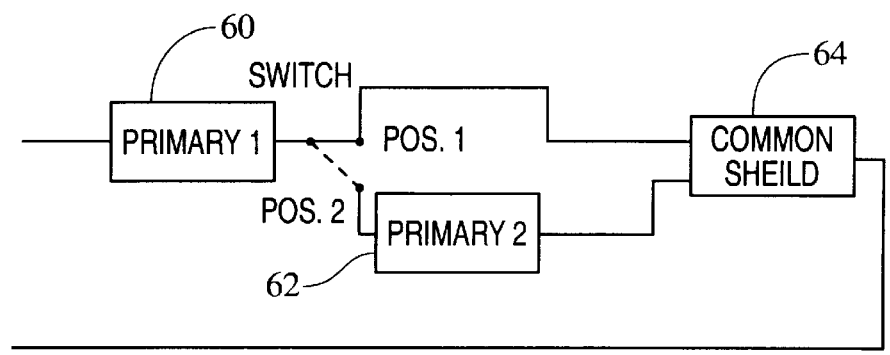

FIGS. 4A, 4B, and 4C show alternate ways of electrically connecting the two primary coil sets 60, 62 with the single shield coil set 64. According to FIGS. 4A, 4B, and 4C, alternative methods include the in-series or in-parallel connections of the two primaries with the single shield, or independent connections between the two primaries and the single shield. It is also contemplated that the primary and shielding coils can be interleaved or stacked depending on radius requirements.

In sum, the double duty gradient coil assembly of the present invention utilizes only one shield coil set to control the fringe field of two independent primary coil sets over a prescribed imaging volume(s). The first primary coil-single shield configuration is a high-efficiency configuration with low quality field, and the second primary coil-single shield configuration is a conventional efficiency configuration with moderate gradient strength and high quality field. The single shield two primary coil configuration can be adjusted such that each primary single shield coil configuration can generate the desired field qualities inside a common imaging volume. The configuration of two primary coil sets with a single common shield set helps on the reduction of the cost of manufacturing, since the second shield coil set is not necessary. In addition, the construction of a dual duty gradient set can be more simple and compact. The single shield two primary coil configuration can be adjusted such that each primary single shield coil configuration can generate the desired field qualities in such a way that both coils have the same length.

It should be appreciated that the specified current patterns can be changed to produce either better linearity at the price of coil efficiency, and/ or greater efficiency at the price of linearity. Further, the dimensions (radius and/or length) of the cylindrical gradient coils can be changed to be increased or decreased according to the preferred application. In addition, the lengths of the two primary coils can be similar or different. And the perspective imaging volumes that the two primary coils with the single shield generate can be the same or different.

It is contemplated that the two primaries and the single shield coil sets can be mounted on the respective gradient tube or tubes in any manner known in the art. Each primary coil can be etched on each side of a dielectric backing. Each primary coil can be etched on a separate backing and can be placed on the inside or outside surface of the gradient tube structure. In addition, a single or double former can be used to mount the two primary coil sets and the secondary gradient structure.

The present invention can be applied to other alternative gradient coil geometries, such as elliptical, planar, flared, etc., as well as the asymmetric gradient coil designs or any combination thereof. The present invention can be also applied to the design of gradient coil structures suitable for vertically (or transversely) oriented main magnetic fields. Further, the disclosed primary and screen coil sets can be bunched (concentrated) or thumbprint designs generated using forward or inverse approach methods. In addition, the two primary and the shield coils can have any possible mixing of bunched and/or thumbprint designs.

It is contemplated that zero net thrust force or torque can be incorporated into the proposed design algorithm in a known manner. Further, it is contemplated that more than two primary coils and more than one screening coil can also be designed by employing the above process, as long as the total number of the screening coils is less than the total number of the primary coils, and the number of screening coils is not zero. It is also contemplated that the first primary coil with the common shield set can be optimized simultaneously or separate from the second primary coil with the common shield set.

The invention has been described with reference to a preferred embodiment. Obviously, modifications and alterations will occur to others upon reading and understanding the preceding detailed description. It is intended that the invention be construed as including all such modifications and alterations insofar as they come within the scope of the appended claims and/or equivalents thereof.

Having thus described the preferred embodiment, the invention is now claimed to be:

1. A method of designing a shielded gradient coil assembly for magnetic resonance imaging systems comprising:

(a) generating a first continuous current distribution for a first primary coil set such that the first continuous current distribution is confined within predetermined finite geometric boundaries of a first surface defined by two dimensions and generates a first magnetic gradient field across an imaging region, the first magnetic gradient field constrained to predetermined values at specified spatial locations within the imaging region;

(b) generating a second continuous current distribution for a second primary coil set such that the second continuous current distribution is confined within predetermined finite geometric boundaries of a second surface defined by two dimensions and generates a second magnetic gradient field across an imaging region, the second magnetic gradient field constrained to predetermined values at specified spatial locations within the imaging region; and (c) generating a third continuous current distribution for a shielding coil set such that the third continuous current distribution is confined within predetermined finite geometric boundaries of a surface surrounding the primary coil set and second primary coil set, such that the third continuous current distribution generates a magnetic field which substantially cancels in an area outside a region defined by the shielding coil set a first fringe magnetic field generated by the first continuous current distribution and a second fringe magnetic field generated by the second continuous current distribution.

2. The method of claim 1, further including:

d) evaluating eddy currents within a prescribed imaging volume for i) the first primary gradient coil set and the shielding coil set, and ii) the second primary gradient coil set and the shielding coil set; and e) modifying at least one characteristic of the first primary gradient coil set or the second primary gradient coil set and then repeating steps a) through d) when the eddy currents from either i) the first primary gradient coil set and the shielding coil set or ii) the second primary gradient coil set and the shielding coil set do not meet an eddy current target value for the prescribed imaging volume.

3. The method of claim 2, further including:

f) discretizing i) the first primary gradient coil set and the shielding coil set and ii) the second primary gradient coil set and the shielding coil set when the eddy currents from either i) the first primary gradient coil set and the shielding coil set or ii) the second primary gradient coil set and the shielding coil set meet the eddy current target value for the prescribed imaging volume; and g) modifying at least one characteristic of the first primary gradient coil set or the second primary gradient coil set and then repeating steps a) through h) when the integer number of turns of i) the first primary gradient coil set do not equal the integer number of turns of the shielding coil set or when ii) the integer number of turns of the second primary gradient coil set do not equal the integer number of turns of the shielding coil set.

4. The method of claim 3, where at least one of steps e) and g) includes:
   h) modifying at least one of a length and a radius of i) the first primary gradient coil set and the shielding coil set or ii) the second primary gradient coil set and the shielding coil set.

5. The method of claim 4, where at least one of steps e) and g) includes:
   i) modifying a field constraint of i) the first primary gradient coil set and the shielding coil set or ii) the second primary gradient coil set and the shielding coil set.

6. The method of claim 3, where at least one of steps e) and g) includes:
   h) modifying a field constraint of i) the first primary gradient coil set and the common shielding coil set or ii) the second primary gradient coil set and the common shielding coil set.

7. The method of claim 1, wherein the first primary coil set is a high-efficiency primary coil set that enhances the performance of ultra fast MR sequencing, and the second primary coil set is a low-efficiency primary coil set having a high-quality gradient field.

8. A shielded coil assembly designed by the method of claim 1.

9. The method of claim 1, wherein at least one of the first continuous current distribution, the second continuous current distribution, and the third continuous current distribution are generated using the inverse approach method.

10. A method of designing a gradient coil assembly for a magnetic resonance imaging system comprising:
    a) defining characteristics of i) a first primary gradient coil set and a common shielding coil set, and ii) a second primary gradient coil set and the common shielding coil set;
    b) optimizing i) the first primary gradient coil set with the common shielding coil set and ii) the second gradient coil set with the common shielding coil set utilizing an energy/inductance minimization algorithm;
    c) evaluating eddy currents within a prescribed imaging volume for i) the first primary gradient coil set and the common shielding coil set, and ii) the second primary gradient coil set and the common shielding coil set;
    d) modifying at least one of the characteristics defined in step a), and repeating steps b) through d) when the eddy currents from either i) the first primary gradient coil set and the common shielding coil set or ii) the second primary gradient coil set and the common shielding coil set do not meet an eddy current target value for the prescribed imaging volume;
    e) discretizing i) the first primary gradient coil set and the common shielding coil set and ii) the second primary gradient coil set and the common shielding coil set when the eddy currents from either i) the first primary gradient coil set and the common shielding coil set or ii) the second primary gradient coil set and the common shielding coil set meet the eddy current target value for the prescribed imaging volume; and
    f) modifying at least one of the characteristics defined in step a) and repeating steps b) through f) when the integer number of turns of i) the first primary gradient coil set do not equal the integer number of turns of the common shielding coil set or when ii) the integer number of turns of the second primary gradient coil set do not equal the integer number of turns of the common shielding coil set.

11. The method of claim 10, where step a) includes:
    g) defining a geometric configuration of i) the first primary gradient coil set and the common shielding coil set, and ii) the second primary gradient coil set and the common shielding coil set.

12. The method of claim 10, where step d) includes:
    g) modifying at least one of a length and a radius of i) the first primary gradient coil set and the common shielding coil set or ii) the second primary gradient coil set and the common shielding coil set.

13. The method of claim 10, where step f) includes:
    g) modifying at least one of a length and a radius of i) the first primary gradient coil set and the common shielding coil set or ii) the second primary gradient coil set and the common shielding coil set.

14. The method of claim 10, where step d) includes:
    g) modifying a field constraint of i) the first primary gradient coil set and the common shielding coil set or ii) the second primary gradient coil set and the common shielding coil set.

15. The method of claim 10, where step f) includes:
    g) modifying a field constraint of i) the first primary gradient coil set and the common shielding coil set or ii) the second primary gradient coil set and the common shielding coil set.

16. The method of claim 10, wherein the first primary coil set is a high-efficiency primary coil set that enhances the performance of ultra fast MR sequencing, and the second primary coil set is a low-efficiency primary coil set having a high-quality gradient field.

17. A shielded coil assembly designed by the method of claim 10.

18. A magnetic resonance imaging system comprising:
    a main magnet for generating a main magnetic field through an examination region, the main magnet being arranged such that its geometry defines the examination region;
    a couch which supports a subject to be examined within the examination region;
    a radio frequency coil disposed adjacent the examination region for transmitting radio frequency signals into the examination region and selectively exciting dipoles disposed therein;
    a radio frequency transmitter for driving the radio frequency coil;
    a receiver which receives magnetic resonance signals from resonating dipoles within the examination region;
    an image processor which reconstructs an image representation from the received magnetic resonance signals for display on a human readable display; and,
    a gradient coil assembly for generating substantially linear magnetic gradients across the main magnetic field, the gradient coil assembly including;
      a first primary gradient coil set disposed about the examination region including an array of conductive coil loops arranged such that a current density flowing thereon generates the substantially linear magnetic gradients;
      a second primary gradient coil set disposed about the examination region including an array of conductive coil loops arranged such that a current density flowing thereon generates the substantially linear magnetic gradients; and a shielding coil set disposed about the first primary coil set and the second primary coil set including an array of conductive coil loops arranged such that a current density flowing thereon substantially shields a fringe field from the first primary coil set and a fringe field from at least one of the second primary coil set and the first and second primary coil sets operating concurrently.

19. The system of claim 18, wherein the first primary gradient coil set is optimized with the common shielding coil set utilizing an energy/inductance minimization algorithm and the second gradient coil set is optimized with the common shielding coil set utilizing an energy/inductance minimization algorithm.

20. The system of claim 18, further including:
   a switch for selectively switching the shield coil set electrically in series with i) the first primary gradient coil set and ii) one of the second primary gradient coil set and a combination of the first and second primary gradient coil sets.

21. A method of designing gradient coil assemblies which include a first primary coil, a second primary coil, and a single shield coil for magnetic resonance imaging systems, the method comprising:
   a) selecting a first primary coil current distribution for the first primary coil which when operated with the shield coil generates gradient pulses in a imaging region with rapid rise times for ultra fast imaging sequences;
   b) selecting a second primary coil current distribution for the second primary coil which when operated with the shield coil and one of i) alone, and ii) in combination with the first primary coil generates accurate gradient pulses in the imaging region with slower rise times than the first primary coil; and
   c) selecting a single shield coil current distribution which substantially cancels gradient magnetic fields outside of the imaging region when i) the first primary coil and the shield coil are operated concurrently and ii) one of the second primary coil and the combination of the first and second primary coils are operated concurrently with the sheild coil.

22. The method of claim 21, further including:
   iteratively adjusting the first primary coil current distribution, the second primary coil current distribution, and the shield coil current distribution until an optimum combination of rapid rise times, gradient accuracy, and gradient cancellation outside the imaging region is achieved.

* * * * *